United States Patent
Shibata et al.

(10) Patent No.: US 12,408,556 B2
(45) Date of Patent: Sep. 2, 2025

(54) PIEZOELECTRIC STACK, PIEZOELECTRIC ELEMENT, AND METHOD OF MANUFACTURING PIEZOELECTRIC STACK

(71) Applicant: SUMITOMO CHEMICAL COMPANY, LIMITED, Tokyo (JP)

(72) Inventors: Kenji Shibata, Hitachi (JP); Kazutoshi Watanabe, Hitachi (JP); Fumimasa Horikiri, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 1074 days.

(21) Appl. No.: 17/299,951

(22) PCT Filed: Nov. 14, 2019

(86) PCT No.: PCT/JP2019/044775
§ 371 (c)(1),
(2) Date: Oct. 22, 2021

(87) PCT Pub. No.: WO2020/116123
PCT Pub. Date: Jun. 11, 2020

(65) Prior Publication Data
US 2023/0135208 A1 May 4, 2023

(30) Foreign Application Priority Data
Dec. 7, 2018 (JP) .................. 2018-229831

(51) Int. Cl.
*H10N 30/853* (2023.01)
*C01G 33/00* (2006.01)
*H10N 30/076* (2023.01)

(52) U.S. Cl.
CPC ....... *H10N 30/8542* (2023.02); *C01G 33/006* (2013.01); *H10N 30/076* (2023.02);
(Continued)

(58) Field of Classification Search
CPC .... H10N 30/704; H10N 30/076; H10N 30/04; H10N 30/8542; H10N 30/073;
(Continued)

(56) References Cited

U.S. PATENT DOCUMENTS

2007/0126313 A1 6/2007 Ueno et al.
2009/0236944 A1 9/2009 Shibata et al.
(Continued)

FOREIGN PATENT DOCUMENTS

JP 2007-184513 A 7/2007
JP 2008-159807 A 7/2008
(Continued)

OTHER PUBLICATIONS

International Searching Authority, "International Search Report," issued in connection with International Patent Application No. PCT/JP2019/044775, dated Jan. 28, 2020.
(Continued)

*Primary Examiner* — J. San Martin
(74) *Attorney, Agent, or Firm* — Foley & Lardner LLP (57) ABSTRACT

A piezoelectric stack, including: a substrate; an electrode film; and a piezoelectric film comprising an alkali niobium oxide of a perovskite structure represented by a composition formula of $(K_{1-x}Na_x)NbO_3$ ($0<x<1$), wherein an average light transmittance through the piezoelectric film in a wavelength region of visible light and near-infrared ray is 65% or more.

8 Claims, 4 Drawing Sheets (52) U.S. Cl.
CPC ...... *C01P 2002/34* (2013.01); *C01P 2002/54* (2013.01); *C01P 2006/40* (2013.01); *C01P 2006/60* (2013.01)

(58) Field of Classification Search
CPC ................ H10N 30/878; C23C 14/088; C23C 14/5806; H03H 9/02574; H03H 9/02031; H03H 3/02; H03H 3/04; C01G 33/006; C01P 2002/54; C01P 2006/40; C01P 2002/34; C01P 2006/60
See application file for complete search history.

(56) References Cited

U.S. PATENT DOCUMENTS

| | | | |
|---|---|---|---|
| 2013/0009519 A1* | 1/2013 | Shibata | C23C 14/088 310/348 |
| 2013/0106242 A1* | 5/2013 | Shibata | C04B 35/495 428/471 |
| 2015/0376068 A1 | 12/2015 | Shannigrahi et al. | |
| 2017/0228072 A1 | 8/2017 | Amin et al. | |
| 2018/0301618 A1* | 10/2018 | Shibata | B41J 2/14201 |
| 2020/0161533 A1* | 5/2020 | Shibata | H03H 3/08 |

FOREIGN PATENT DOCUMENTS

| | | |
|---|---|---|
| JP | 2011-143259 A | 7/2011 |
| JP | 2017-538189 A | 12/2017 |
| JP | 2018-019108 A | 2/2018 |
| JP | 2018-190891 A | 11/2018 |
| WO | WO-2016/061155 A1 | 4/2016 |
| WO | WO-2018/064722 A1 | 4/2018 |

OTHER PUBLICATIONS

International Searching Authority, "Written Opinion," issued in connection with International Patent Application No. PCT/JP2019/044775, dated Jan. 28, 2020.

English language Translation of the International Preliminary Report on Patentability, with Written Opinion, on PCT/JP2019/044775 dated Jun. 17, 2021.

Extended European Search Report issued in corresponding European Patent Application No. 19893646.0, dated May 25, 2023.

X Zhao et al: "Simultaneous realization of high transparency and piezoelectricity in low symmetry KNN-based ceramics", Journal of the American Ceramic Society, vol. 102, Nov. 2, 2018, pp. 3498-3509, XP055722002, DOI: 10.1111/jace.16189.

* cited by examiner

PIEZOELECTRIC STACK, PIEZOELECTRIC ELEMENT, AND METHOD OF MANUFACTURING PIEZOELECTRIC STACK

CROSS-REFERENCE TO RELATED APPLICATIONS

The present application claims priority under 37 U.S.C. § 371 to International Patent Application No. PCT/JP2019/044775, filed Nov. 14, 2019, which claims priority to and the benefit of Japanese Patent Application No. 2018-229831, filed on Dec. 7, 2018. The contents of these applications are hereby incorporated by reference in their entireties.

TECHNICAL FIELD

The present disclosure relates to a piezoelectric stack, a piezoelectric element, and a method of manufacturing a piezoelectric stack.

DESCRIPTION OF RELATED ART

A piezoelectric material is utilized widely for a functional electronic component such as a sensor and an actuator. For example, potassium sodium niobate (KNN) may be used as the piezoelectric material (see patent documents 1 and 2, for example). In recent years, there is a strong demand for piezoelectric materials comprising KNN, which has a higher versatility.

PRIOR ART DOCUMENT

Patent Document

Patent Document 1: Japanese Patent Laid Open Publication No. 2007-184513
Patent document 2: Japanese Patent Laid Open Publication No.2008-159807

SUMMARY OF THE INVENTION

Problems to be Solved by the Invention

An object of the present disclosure is to provide a piezoelectric film having an enhanced versatility, and a related technique thereof.

Means for Solving the Problem

According to an aspect of the present disclosure, there is provided a piezoelectric stack and a related technique thereof, including:
a substrate;
an electrode film; and
a piezoelectric film comprising an alkali niobium oxide of a perovskite structure represented by a composition formula of $(K_{1-x}Na_x)NbO_3$ (0<x<1),
wherein an average light transmittance through the piezoelectric film in a wavelength region of visible light and near-infrared ray is 65% or more.

Advantage of the Invention

According to the present disclosure, there is provided a piezoelectric film having an enhanced versatility, and a related technique thereof.

DETAILED DESCRIPTION OF THE INVENTION

Embodiment of the Present Disclosure

An embodiment of the present disclosure will be described hereafter, with reference to FIG. 1 and FIG. 2.

(1) Configuration of Piezoelectric Stack

Figure 1:
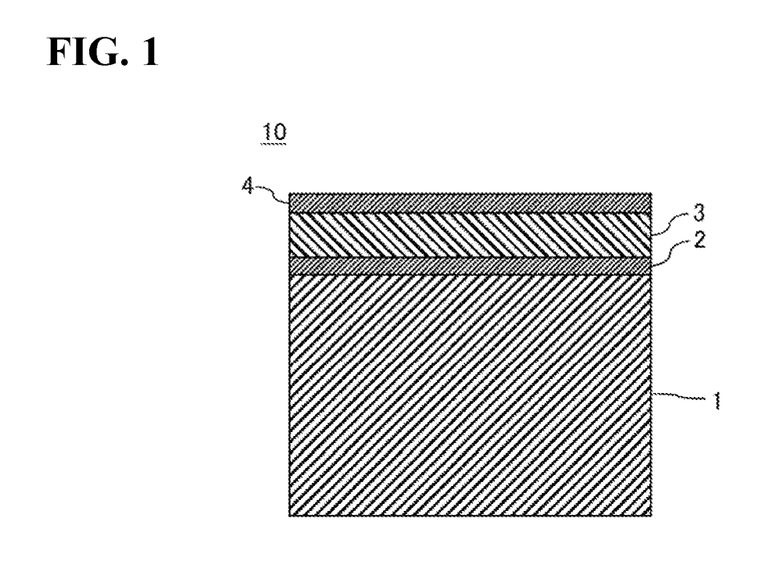
FIG. 1 is a view illustrating an example of a cross-sectional structure of a piezoelectric stack 10 according to an embodiment of the present disclosure.

As illustrated in FIG. 1, a stack (stacked substrate) 10 (also referred to as a piezoelectric stack 10 hereafter) having a piezoelectric film according to the present embodiment, includes a substrate 1, a bottom electrode film 2 formed (deposited) on the substrate 1, a piezoelectric film (piezoelectric thin film) 3 deposited on the bottom electrode film 2, and a top electrode film 4 deposited on the piezoelectric film 3.

A substrate (transparent substrate) with a light transmittance of, for example, 65% or more at least in a wavelength region of visible light (about 380 to 800 nm), preferably in a wavelength region of visible light and near-infrared ray (380 to 1400 nm) can be preferably used as a substrate 1. For example, a strontium titanate ($SrTiO_3$, abbreviated as STO) substrate, a quartz glass ($SiO_2$) substrate, a sapphire ($Al_2O_3$) substrate, a gallium nitride (GaN) substrate, or a gallium oxide ($Ga_2O_3$) substrate can be used as the substrate 1. A thickness of the substrate 1 is, for example, 300 to 1000 μm.

The bottom electrode film 2 is preferably comprised of an electrode (transparent electrode) with a light transmittance of, for example, 65% or more at least in the wavelength region of visible light, preferably in the wavelength region of visible light and near-infrared ray. The bottom electrode film 2 may be deposited using various metallic oxides such as strontium ruthenium oxide ($SrRuO_3$, abbreviated as SRO), lanthanum nickel oxide ($LaNiO_3$, abbreviated as LNO). The bottom electrode film 2 is a single-crystal film or a poly-crystal film. When the bottom electrode film 2 is deposited using SRO, crystals comprised in the bottom electrode film 2 (SRO-film) are preferably oriented preferentially in (100) direction with respect to a surface of the substrate 1. That is, a surface of the SRO-film (a surface to be a base of the piezoelectric film 3) is preferably mainly comprised of SRO-(100). The same applies to LNO. That is, when the bottom electrode film 2 is deposited using LNO, a surface of the LNO-film is preferably mainly comprised of LNO-(100). The bottom electrode film 2 can be deposited by a method such as a sputtering method, or an evaporation method. Instead of SRO, LNO, the bottom electrode film 2 can also be deposited using indium oxide such as indium tin oxide (ITO), indium zinc oxide (IZO), indium gallium zinc oxide (IGZO). A thickness of the bottom electrode film 2 is, for example, 10 to 400 nm.

The bottom electrode film 2 can also be a thin film (thin metal film) deposited using various metals such as platinum (Pt), gold (Au), or an alloy containing the above various metals as its main components. When the bottom electrode film 2 is deposited using Pt, the bottom electrode film 2 (Pt-film) is preferably oriented preferentially in (111) direction with respect to the surface of the substrate 1. That is, a surface of the Pt-film is preferably comprised of Pt-(111). The bottom electrode film 2 (Pt-film) can be deposited by a method such as a sputtering method, or an evaporation method. The thickness of the bottom electrode film 2 (Pt-film) is, for example, 1 to 10 nm, preferably 2 to 5 nm.

The piezoelectric film 3 can be deposited, for example, using an alkali niobium oxide which contains potassium (K), sodium (Na), and niobium (Nb), and is represented by a composition formula of $(K_{1-x}Na_x)Nb_yO_3$, namely, potassium sodium niobate (KNN). A coefficient x [$=Na/(K+Na)$] in the above-mentioned composition formula is a value in a range of $0<x<1$, preferably $0.4 \leq x \leq 0.7$. A coefficient y [$=(K+Na)/Nb$] in the above-mentioned composition formula is a value in a range of $0.7 \leq y \leq 1.50$. The piezoelectric film 3 is a KNN polycrystalline film (also referred to as a KNN-film 3 hereafter). A crystal structure of KNN is a perovskite structure.

Preferably, crystals comprised in the KNN-film 3 are oriented preferentially in (001) direction with respect to the surface of the substrate 1. That is, a surface of the KNN-film 3 (a surface to be a base of the top electrode film 4) is preferably mainly comprised of KNN-(001). By depositing the KNN-film 3 directly on the bottom electrode film 2 (the SRO-film oriented preferentially in (100) direction or the Pt-film oriented preferentially in (111) direction, with respect to the surface of the substrate 1), the crystals comprised in the KNN-film 3 can be easily oriented preferentially in (001) direction with respect to the surface of the substrate 1. For example, 80% or more crystals in a crystal grain group comprised in the KNN-film 3 can be oriented in (001) direction with respect to the surface of the substrate 1, and 80% or more regions of the surface of the KNN-film 3 can be KNN-(001). A thickness of the KNN-film 3 is, for example, 0.1 to 10 μm.

The KNN-film 3 can be deposited by a method such as a sputtering method, a PLD (Pulsed Laser Deposition) method, or a sol-gel method. A composition ratio of the KNN-film 3 can be adjusted by controlling a composition of a target material used during sputtering deposition, for example. The target material can be produced by mixing and burning $K_2CO_3$-powder, $Na_2CO_3$-powder, and $Nb_2O_5$-powder, for example. In this case, the composition of the target material can be controlled by adjusting a mixed ratio of $K_2CO_3$-powder, $Na_2CO_3$-powder, $Nb_2O_5$-powder, and the like.

The KNN-film 3 has optical transmission (transparency). An average light transmittance through the KNN-film 3 in the wavelength region of visible light and near-infrared ray (380 to 1400 nm) is 65% or more. An average light transmittance through the KNN-film 3 in the wavelength region of visible light (380 to 800 nm) is, for example, 56% or more. There is no particular limitation on an upper limit of the average light transmittance, and the upper limit is preferably 100%. However, according to a current technique, the upper limit of the average light transmittance through the KNN-film 3 in the wavelength region of visible light and near-infrared ray is about 75%.

The term "average light transmittance" used herein means an average value of the light transmittance through the KNN-film 3 in a prescribed wavelength region (range). The light transmittance through the KNN-film 3 can be measured by a known light transmittance measuring device. In the present embodiment, the light transmittance through the KNN-film is measured by a spectroscopic ellipsometer (M-2000, manufactured by J. A. Woollam Co., Inc.).

An average light transmittance through the KNN-film 3 in a wavelength region of purple visible light (380 nm or more and less than 450 nm) is preferably 39.5% or more and 39.9% or less. An average light transmittance through the KNN-film 3 in a wavelength region of blue visible light (450 nm or more and less than 495 nm) is preferably 48.5% or more and 54% or less. An average light transmittance through the KNN-film 3 in a wavelength region of green visible light (495 nm or more and less than 570 nm) is preferably 55% or more and 61.5% or less. An average light transmittance through the KNN-film 3 in a wavelength region of yellow visible light (570 nm or more and less than 590 nm) is preferably 58.5% or more and 65% or less. An average light transmittance through the KNN-film 3 in a wavelength region of orange visible light (590 nm or more and less than 620 nm) is preferably 60% or more and 66.5% or less. An average light transmittance through the KNN-film 3 in a wavelength region of red visible light (620 nm or more and less than 750 nm) is preferably 63.5% or more and 70% or less. An average light transmittance through the KNN-film 3 in a wavelength region of reddish purple visible light (750 nm or more and 800 nm or less) is preferably 66.5% or more and 71.5% or less.

For example, a mixed gas ($Ar/O_2$-mixed gas) of argon (Ar) gas and oxygen ($O_2$) gas is used as an atmosphere gas during sputtering deposition of the KNN-film 3. In order to increase the light transmittance through the KNN-film 3, it is effective to increase a partial pressure ($H_2O$-partial pressure) of water contained in $Ar/O_2$-mixed gas during sputtering deposition, or to perform a heat treatment on the KNN-film 3 in an ambient air or in an oxygen-containing atmosphere after deposition of the KNN-film 3 and before deposition of the top electrode film 4 described later. Thereby, the KNN-film 3 can be sufficiently oxidized and oxygen deficiencies in the KNN-film 3 can be reduced. As a result, the light transmittance through the KNN-film 3 can be increased.

For example, the light transmittance through the KNN-film 3 can fall within the above-mentioned range by performing the heat treatment on the KNN-film 3 for 0.5 hours or more, preferably 24 hours or more, and more preferably 40 hours or more, per 1 μm thickness of the KNN-film 3, under conditions of 600 to 1000° C., preferably 650 to 900° C. in an ambient air or in an oxygen-containing atmosphere. The heat treatment is preferably performed at a temperature equal to or higher than a deposition temperature of the KNN-film 3. The light transmittance through the KNN-film 3 can fall within the above-mentioned range, for example, by setting the $H_2O$-partial pressure during the deposition of the KNN-film 3 to 0.05 Pa or more, instead of performing the heat treatment.

The KNN-film 3 preferably contains a metallic element selected from a group consisting of copper (Cu) and manganese (Mn) at a concentration within a range of, for example, 0.2 to 2.0 at %.

By adding at least one of Cu or Mn within the above-mentioned concentration range into the KNN-film 3, a film property of the KNN-film 3 can be enhanced. For example, an insulation property (a leak resistance) of the KNN-film 3 can be enhanced, and a dielectric constant of the KNN-film 3 can be a value suitable for applications of the piezoelectric stack 10. Further, by adding Cu within the above-mentioned concentration range into the KNN-film 3, a resistance to a fluorinated etching liquid (e.g., a buffered hydrofluoric acid (BHF) solution containing hydrogen fluoride (HF) and ammonium fluoride ($NH_4F$) at respective prescribed concentrations), that is, an etching resistance can be enhanced, in addition to the above-mentioned insulation property. Thereby, a formation of a protect film for protecting an exposed surface of the KNN-film 3 is not required. That is, the BHF solution can be used as an etching liquid with no need to form the protect film. As a result, processes after forming the piezoelectric stack can be simplified.

When the KNN-film 3 contains a metal element such as Cu or Mn, the light transmittance through the KNN-film 3 tends to decrease. However, even when the KNN-film 3 contains Cu, Mn, or the like, the light transmittance through the KNN-film 3 can fall within the above-mentioned range by increasing the $H_2O$-partial pressure in the deposition atmosphere of the KNN-film 3 or by performing the heat treatment after the deposition of the KNN-film 3, as long as a total concentration of Cu and Mn contained in the KNN-film 3 is within the above-mentioned range.

Further, with the total concentration of Cu and Mn in the KNN-film 3 falling within the above-mentioned range, the dielectric constant of the KNN-film 3 does not become excessively high, and a sensitivity tends to be less likely to decrease when the piezoelectric stack 10 is utilized, for example, as a sensor. One reason can be considered as follows: an addition amount of Cu or Mn is appropriate, and it is less likely to be difficult to preferentially orient the crystals comprised in the KNN-film 3 in (001) direction with respect to the surface of the substrate 1. Even when the $H_2O$-partial pressure in the deposition atmosphere of the KNN-film 3 is increased or the heat treatment is performed after the deposition of the KNN-film 3, the light transmittance through the KNN-film 3 tends to fall within the above-mentioned range.

The KNN-film 3 may contain an element other than K, Na, Nb, Cu, and Mn such as lithium (Li), Ta, antimony (Sb) at a concentration where the light transmittance through the KNN-film 3 can be maintained within the above-mentioned range, for example, at the concentration of 5 at % or less.

The top electrode film 4 is preferably comprised of an electrode (transparent electrode) with a light transmittance of, for example, 65% or more at least in the wavelength region of visible light, preferably in the wavelength region of visible light and near-infrared ray. The top electrode film 4 can be deposited using a metal oxide such as SRO or LNO, or an indium oxide such as ITO, IZO, or IGZO. The top electrode film 4 does not greatly affect the crystal structure of the KNN-film 3, unlike the bottom electrode film 2. Therefore, a crystal structure of the top electrode film 4, and a deposition method of the top electrode film 4 are not particularly limited. The top electrode film 4 can be deposited by a method such as a sputtering method, an evaporation method, a plating method, or a metal paste method. A thickness of the top electrode film 4 is, for example, 3 to 1000 nm. The top electrode film 4 can also be a thin film (thin metal film) deposited using various metals such as Pt, Au, or an alloy containing the above various metals as its main components. When the top electrode film 4 is deposited using Pt, Au, or the like, the thickness of the top electrode film 4 is, for example, 1 to 10 nm, preferably 2 to 5 nm. The top electrode film 4 can also be a fine wire (metal fine wire) formed using the various metals such as Pt, Au, or an alloy containing the above various metals as its main components.

Since the piezoelectric stack 10 includes the above-mentioned substrate 1 (transparent substrate), the bottom electrode film 2 (transparent electrode), the KNN-film 3 having transparency, and the top electrode film 4 (transparent electrode), the light transmittance (average light transmittance) through the entire piezoelectric stack 10 at least in the wavelength region of visible light, preferably in the wavelength region of visible light and near-infrared ray can be, for example, 50% or more, preferably 60% or more.

(2) Configuration of Piezoelectric Device

Figure 2:
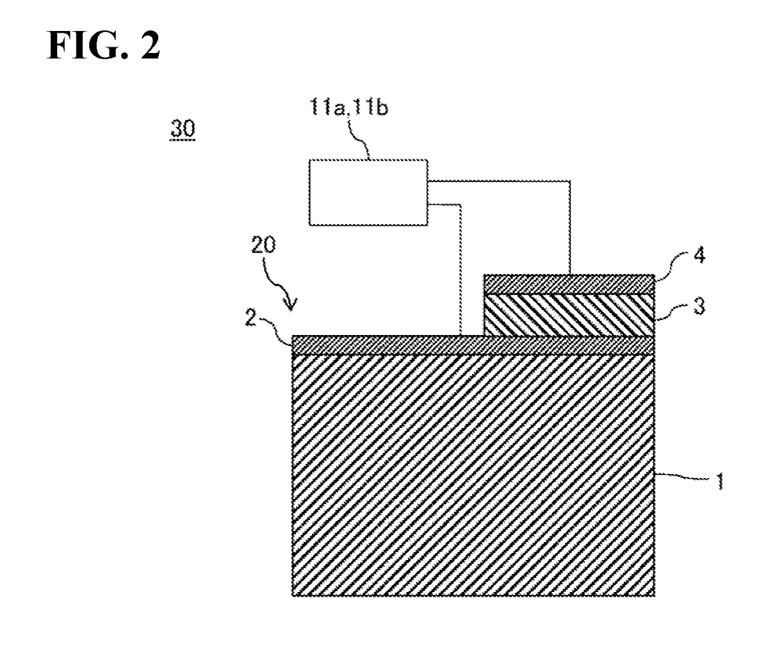
FIG. 2 is a schematic configuration view of a piezoelectric device 30 according to an embodiment of the present disclosure.

FIG. 2 is a schematic configuration view of a piezoelectric device 30 according to the present embodiment. The piezoelectric device 30 includes at least a piezoelectric element 20 obtained by shaping the above-mentioned piezoelectric stack 10 into a prescribed form, and a voltage detection means 11a or a voltage application means 11b connected to the piezoelectric element 20.

By connecting the voltage detection means 11a between the bottom electrode film 2 and the top electrode film 4 of the piezoelectric element 20, the piezoelectric device 30 can function as a sensor. When the KNN-film 3 is deformed according to a variation of some physical quantity, a voltage is generated between the bottom electrode film 2 and the top electrode film 4 due to the deformation. By detecting this voltage using the voltage detection means 11a, the physical quantity applied to the KNN-film 3 can be measured. As mentioned above, since the KNN-film 3 has optical transmission, the piezoelectric device 30 can be suitably used for applications requiring optical transmission (transparency). For example, the piezoelectric device 30 can be suitably used as a sensor for a touch panel or a mobile phone display.

By connecting the voltage application means 11b between the bottom electrode film 2 and the top electrode film 4 of the piezoelectric element 20, the piezoelectric device 30 can function as an actuator. By applying a voltage between the bottom electrode film 2 and the top electrode film 4 using the voltage application means 11b, the KNN-film 3 can be deformed. Various structures connected to the piezoelectric device 30 can be actuated due to such a deformation motion.

(3) Method of Manufacturing Piezoelectric Stack, Piezoelectric Element, and Piezoelectric Device Next, a method of manufacturing the above-mentioned piezoelectric stack 10 will be described. First, the bottom electrode film 2 is deposited on any one of main surfaces of the substrate 1. It is also acceptable to prepare the substrate 1 with the bottom electrode film 2 deposited in advance on any one of its main surfaces. Subsequently, the KNN-film 3 is deposited on the bottom electrode film 2 using, for example, the RF sputtering method. After that, the heat treatment is performed on the KNN-film 3. Then, the top electrode film 4 is deposited on the KNN-film 3 after the heat treatment using, for example, the RF sputtering method. Thereby, the piezoelectric stack 10 can be obtained. The piezoelectric element 20 is obtained by shaping this piezoelectric stack 10 into a prescribed form using an etching, etc., and the piezoelectric device 30 is obtained by connecting the voltage detection means 11a or the voltage application means 11b to the piezoelectric element 20.

The following conditions are given as conditions for the deposition of the bottom electrode film 2, the KNN-film 3, and the top electrode film 4, and for the heat treatment of the KNN-film 3.

(Example of Conditions for Deposition of Bottom Electrode Film (SRO-Film) and Top Electrode Film (SRO-Film))
- Temperature (deposition temperature, e.g., substrate temperature): normal temperature (about 27° C.) to 500° C., preferably 150 to 250° C., more preferably about 200° C.
- RF power: 100 to 500 W, preferably 200 to 400 W
- Gas: Ar-gas
- Pressure in Ar-gas atmosphere: 1 to 10 Pa, preferably 3 to 5 Pa
- Deposition time: 3 to 10 minutes, preferably 5 to 6 minutes (Example of Conditions for Deposition of Bottom Electrode Film (Pt-Film) and Top Electrode Film (Pt-Film))
- Temperature (deposition temperature, e.g., substrate temperature): 100 to 500° C., preferably 200 to 400° C.
- RF power: 1000 to 1500 W, preferably 1200 to 1300 W
- Treatment atmosphere: Ar-gas atmosphere
- Atmosphere pressure: 0.1 to 0.5 Pa, preferably 0.2 to 0.4 Pa
- Treatment time: 30 seconds to 2 minutes, preferably about 1 minute (Example of Conditions for Deposition of KNN-Film)
- Temperature (deposition temperature, e.g., substrate temperature): 500 to 700° C., preferably 600° C.
- RF power: 2000 to 2400 W, preferably 2200 W
- Gas: $Ar+O_2$ mixed gas
- Pressure in $Ar+O_2$ mixed gas atmosphere: 0.2 to 0.5 Pa, preferably 0.25 to 0.4 Pa
- Partial pressure of Ar-gas to $O_2$-gas (partial pressure ratio of $Ar/O_2$): 30/1 to 20/1, preferably 27/1 to 23/1
- Deposition rate: 0.5 to 2 μm/hr, preferably 1 to 1.5 μm/hr (Example of Conditions for Heat Treatment After Deposition of KNN-Film)
- Atmosphere: Ambient air or oxygen-containing atmosphere
- Temperature: 600 to 1000° C., preferably 650 to 900° C., more preferably temperature within the above-mentioned range and equal to or higher than the deposition temperature of the KNN-film
- Heat treatment time: 0.5 hours or more, preferably 24 hours or more, more preferably 40 hours or more, per 1 μm thickness of the KNN-film When forming the piezoelectric stack 10, the $H_2O$-partial pressure in the deposition atmosphere of the KNN-film 3 may be increased, instead of performing the heat treatment on the KNN-film 3. Thereby, the light transmittance through the KNN-film 3 can be increased similarly to the above-mentioned case where the heat treatment is performed. In addition to increasing the $H_2O$-partial pressure in the deposition atmosphere of the KNN-film 3, the heat treatment may be performed on the KNN-film 3 after the deposition of the KNN-film 3 and before the deposition of the top electrode film 4. Thereby, the light transmittance through the KNN-film 3 can be further increased.

When the piezoelectric stack 10 is shaped into a prescribed form by etching or the like, for example, a dry etching method such as reactive ion etching or a wet etching method using a prescribed etching liquid can be used as the etching method.

When the piezoelectric stack 10 is shaped by the dry etching, a photoresist pattern as an etching mask for the dry etching is formed on the piezoelectric stack 10 (the top electrode film 4, or the KNN-film 3 in a case where the top electrode film 4 is not provided) by a photolithography process or the like. As the etching mask, a noble metal film (metal mask) such as a chromium (Cr) film, a nickel (Ni) film, a platinum (Pt) film, or a Ti-film may be formed by a sputtering method. Then, the dry etching is performed on the piezoelectric stack 10 (the top electrode film 4, the KNN-film 3, etc.) using a halogen element-containing gas as an etching gas. Examples of the halogen element include chlorine (Cl), fluorine (F) and the like. As the halogen element-containing gas, $BCl_3$-gas, $SiCl_4$-gas, chlorine ($Cl_2$) gas, $CF_4$-gas, $C_4F_8$-gas, or the like can be used.

When the piezoelectric stack 10 is shaped by the wet etching, a silicon oxide ($SiO_x$) film or the like as an etching mask for the wet etching is formed on the piezoelectric stack 10 (the top electrode film 4, or the KNN-film 3 in a case where the top electrode film 4 is not provided). Then, for example, the piezoelectric stack 10 is immersed in an etching liquid containing an alkaline aqueous solution of a chelating agent and not containing hydrofluoric acid, and the wet etching is performed on the piezoelectric stack 10 (the top electrode film 4, the KNN-film 3, etc.). As the etching liquid containing the alkaline aqueous solution of the chelating agent and not containing hydrofluoric acid, an etching liquid obtained by mixing ethylenediaminetetraacetic acid as the chelating agent, aqueous ammonia, and aqueous hydrogen peroxide can be used.

(4) Effect Obtained by the Present Embodiment

According to the present embodiment, one or more of the following effects can be obtained.

(a) In the KNN-film 3 according to the present embodiment, the average light transmittance in the wavelength region of visible light and near-infrared ray is 65% or more. Since the KNN-film 3 has optical transmission as mentioned above, the entire piezoelectric stack 10 can be made a stack having high optical transmission by using a transparent substrate as the substrate 1 and transparent electrodes as the bottom electrode film 2 and the top electrode film 4. For example, the light transmittance through the entire piezoelectric stack 10 at least in the wavelength region of visible light can be 50% or more. The piezoelectric device 30 produced by processing such a piezoelectric stack 10 can be suitably applied to electronic component and the like such as a touch panel, a mobile phone display, a communication device. That is, the versatility of the piezoelectric device 30 can be enhanced. In the KNN-film 3 according to the present embodiment, the average light transmittance is 56% or more, even when attention is focused on the wavelength region of visible light alone. Therefore, the piezoelectric device 30 can be suitably applied to an electronic component and the like that requires the visible light transparency such as a touch panel, a display.

With the average light transmittance through the KNN-film 3 in the wavelength region of visible light and near-infrared ray less than 65%, the image displayed on the display by the piezoelectric device 30 (the KNN-film 3) may be blurred or fuzzy when the above-mentioned piezoelectric device 30 is applied, for example, to a touch panel. Therefore, the above-mentioned piezoelectric device 30 cannot be applied to a touch panel in some cases.

(b) Since the KNN-film 3 contains metal elements selected from a group consisting of Cu and Mn at a concentration within a range of 0.2 at % to 2.0 at %, the insulation property and the etching resistance of the KNN-film 3 can be enhanced, and the dielectric constant of the KNN-film 3 can be a value suitable for applications of the piezoelectric stack 10.

(c) By increasing the $H_2O$-partial pressure in the deposition atmosphere of the KNN-film 3 or by performing the prescribed heat treatment after the deposition of the KNN-film 3, the KNN-film 3 can be sufficiently oxidized to increase the light transmittance through the KNN-film 3. Therefore, even when the KNN-film 3 contains Cu, Mn, and the like within the above-mentioned range, the average light transmittance through the KNN-film 3 can fall within the above-mentioned range. As mentioned above, the present embodiment can make the average light transmittance through the KNN-film 3 fall within the above-mentioned range, while enhancing the insulation property of the KNN-film 3, or adjusting the dielectric constant, the etching resistance, or the like.

(5) Modified Examples

The present embodiment is not limited to the above-mentioned aspects, and can be modified as follows.

(Modified Example 1)

The piezoelectric stack 10 does not have to include the bottom electrode film 2. That is, the piezoelectric stack 10 may include the substrate 1, the KNN-film (piezoelectric film) 3 deposited on the substrate 1, and the top electrode film 4 (electrode film 4) deposited on the KNN-film 3.

Figure 3:
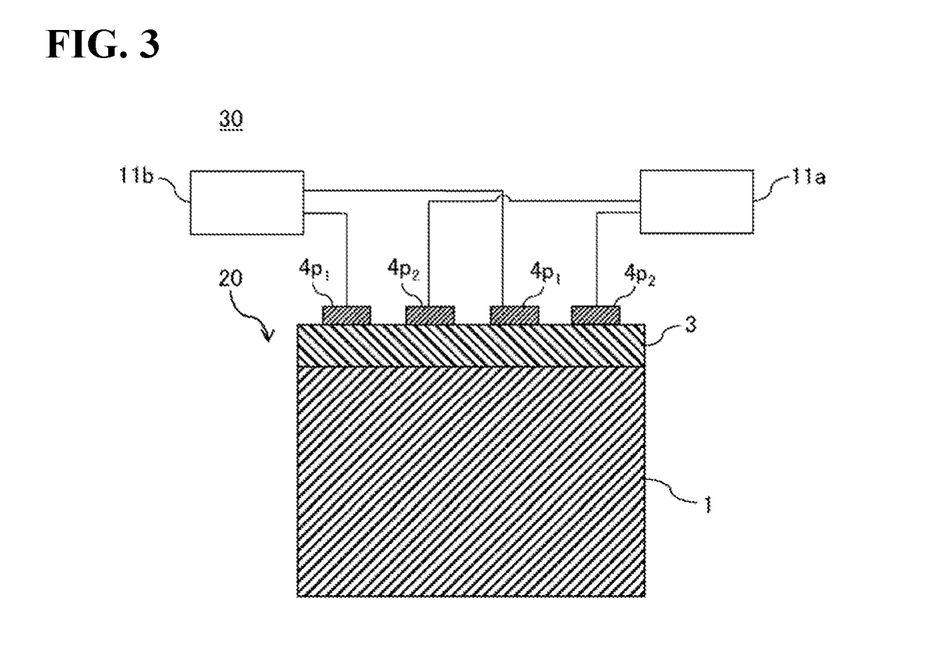
FIG. 3 is a schematic configuration view of a piezoelectric device 30 according to a modified example of the present disclosure.

FIG. 3 is a schematic configuration view of the piezoelectric device 30 produced using the piezoelectric stack 10 according to this modified example. The piezoelectric device 30 includes at least the piezoelectric element 20 obtained by shaping the piezoelectric stack 10 into a prescribed form, and the voltage detection means 11a and the voltage application means 11b connected to the piezoelectric element 20. In this modified example, the piezoelectric element 20 includes a pattern electrode formed by shaping the electrode film 4 into a prescribed pattern. For example, the piezoelectric element 20 includes a pair of positive and negative pattern electrodes $4p_1$ on an input side, and a pair of positive and negative pattern electrodes $4p_2$ on an output side. Examples of the pattern electrodes $4p_1$, $4p_2$ include comb-shaped electrodes (Inter Digital Transducer, abbreviated as IDT).

By connecting the voltage application means 11b between the pattern electrodes $4p_1$ and connecting the voltage detection means 11a between the pattern electrodes $4p_2$, the piezoelectric device 30 can function as a filter device such as a surface acoustic wave (abbreviated as SAW) filter. By applying a voltage between the pattern electrodes $4p_1$ using the voltage application means 11b, SAW can be excited on the surface of the KNN-film 3. A frequency of SAW to be excited can be adjusted, for example, by adjusting a pitch between the pattern electrodes $4p_1$. For example, the shorter the pitch of IDT as the pattern electrodes $4p_1$, the higher the frequency of SAW, and the longer the above-mentioned pitch, the lower the frequency of SAW. The voltage is generated between the pattern electrodes $4p_2$, due to SAW having a prescribed frequency (frequency component) determined according to the pitch of IDT or the like as the pattern electrodes $4p_2$, among SAWs which are excited by the voltage application means 11b, propagate in the KNN-film 3, and reach the pattern electrodes $4p_2$. By detecting this voltage using the voltage detection means 11a, SAW having a prescribed frequency among the excited SAWs can be extracted. The "prescribed frequency" as used herein can include not only a prescribed frequency but also a prescribed frequency band whose center frequency is the prescribed frequency.

(Modified Example 2)

The above-mentioned embodiment has been described for a case where the piezoelectric stack 10 is produced by depositing the bottom electrode film 2, the KNN-film 3, and the top electrode film 4, in this order, on the substrate 1, but is not limited thereto. The piezoelectric stack 10 may be produced as follows. In this modified example, the same components as those in the above-mentioned embodiment are marked with the same numerals, and the explanation therefor will be omitted.

Figure 4A:
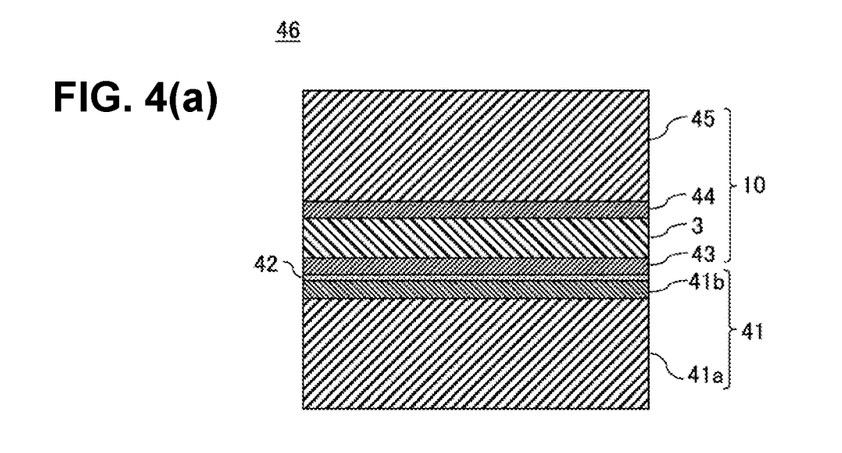
FIG. 4(a) is a schematic configuration view of a stack obtained by another method of manufacturing a piezoelectric stack 10 according to an embodiment of the present disclosure.
Figure 4B:
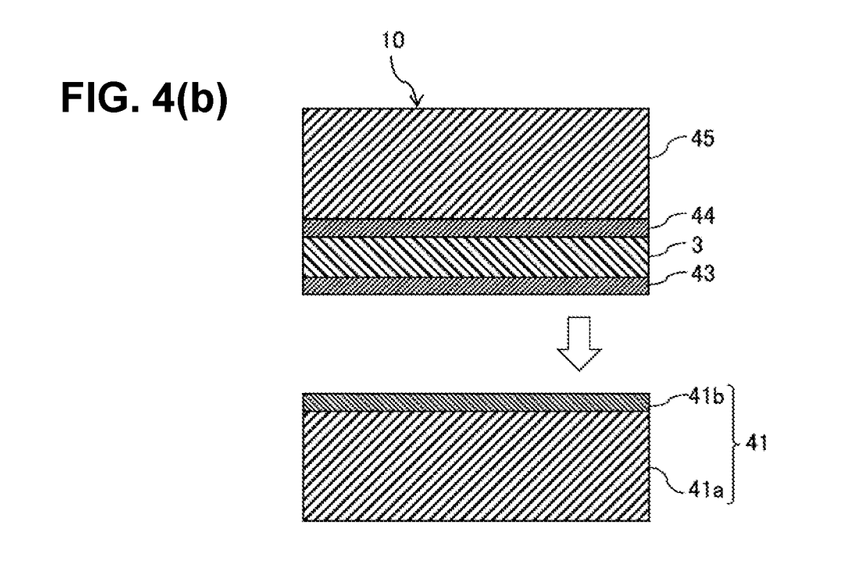
FIG. 4(b) is a schematic view illustrating how a first substrate is separated from the stack illustrated in FIG. 4(a) to obtain the piezoelectric stack 10.

First, as illustrated in FIG. 4(a), a sacrificial layer 42 is formed on a first substrate 41, a first electrode film 43 is deposited on the sacrificial layer 42, the piezoelectric film (KNN-film 3) is deposited on the first electrode film 43, a second electrode film 44 is deposited on the KNN-film 3, and a second substrate 45 is bonded to the second electrode film 44 to form a stack 46. Also in this modified example, by increasing the $H_2O$-partial pressure in the deposition atmosphere of the KNN-film 3 or by performing the prescribed heat treatment after the deposition of the KNN-film 3 and before the deposition of the second electrode film 44, the KNN-film 3 can be sufficiently oxidized to increase the light transmittance through the KNN-film 3. Then, as illustrated in FIG. 4(b), the sacrificial layer 42 of the stack 46 is etched, and the stack 46 is separated into the first substrate 41 and the piezoelectric stack 10 including the first electrode film 43, the KNN-film 3, the second electrode film 44, and the second substrate 45.

Figure 5:
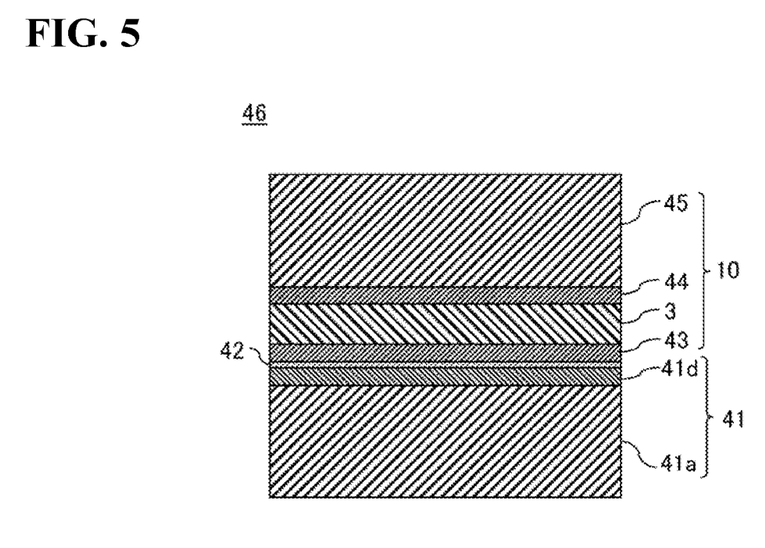
FIG. 5 is a view illustrating an example of a cross-sectional structure of a piezoelectric stack 10 according to a modified example of the present disclosure.

The first substrate 41 is a substrate that will be separated from the stack 46, as described later. For this reason, the first substrate 41 does not have to be a transparent substrate like the above-mentioned substrate 1. As illustrated in FIG. 4(a), a single-crystal silicon (Si) substrate 41a on which a surface oxide film ($SiO_2$-film) 41b such as a thermal oxide film or a CVD (Chemical Vapor Deposition) oxide film is formed, that is, a Si-substrate having the surface oxide film, can be preferably used as the first substrate 41. Further, as illustrated in FIG. 5, a Si-substrate 41a having an insulating film 41d formed on its surface may also be used as the first substrate 41, the insulating film 41d being comprised of an insulating material other than $SiO_2$. Further, a Si-substrate 41a in which Si-(100) or Si-(111), etc., is exposed on a surface thereof, namely, a Si-substrate not having the surface oxide film 41b or the insulating film 41d may also be used as the first substrate 41. Further, an SOI (Silicon On Insulator) substrate, a gallium arsenide (GaAs) substrate, a metal substrate comprised of a metal material such as stainless steel can also be used as the first substrate 41. A thickness of the single-crystal Si-substrate 41a is, for example, 300 to 1000 μm, and a thickness of the surface oxide film 41b is, for example, 5 to 3000 nm.

The sacrificial layer 42 is formed using a material that disappears upon an etching described later. The sacrificial layer 42 can be formed using, for example, Ti, SRO, zinc oxide (ZnO). The sacrificial layer 42 can be formed by a method such as a sputtering method, or an evaporation method. A thickness of the sacrificial layer 42 can be, for example, 1 to 200 nm.

(Example of Conditions for Forming Sacrificial Layer 42 (SRO-Layer, ZnO-Layer))
  Temperature (e.g., substrate temperature): normal temperature (about 27° C.) to 500° C., preferably 100 to 300° C.
  RF power: 100 to 500 W, preferably 200 to 400 W
  Atmosphere: Ar-gas atmosphere
  Pressure in Ar-gas atmosphere: 1 to 10 Pa, preferably 3 to 5 Pa
  Time: 3 to 8 minutes, preferably 3 to 6 minutes
(Example of Conditions for Forming Sacrificial Layer 42 (Ti-Layer))
  Temperature (e.g., substrate temperature): 100 to 500° C., preferably 200 to 400° C.
  RF power: 1000 to 1500 W, preferably 1200 to 1300 W
  Atmosphere: Ar-gas atmosphere
  Pressure in Ar-gas atmosphere: 0.1 to 0.5 Pa, preferably 0.2 to 0.4 Pa
  Time: 30 seconds to 3 minutes, preferably 1 minute The first electrode film 43 is preferably comprised of an electrode (transparent electrode) with a light transmittance of, for example, 65% or more at least in the wavelength region of visible light, preferably in the wavelength region of visible light and near-infrared ray. The first electrode film 43 is a film to be a base for the KNN-film 3. Therefore, the first electrode film 43 preferably has a crystal structure similar to that of the bottom electrode film 2 in the above-mentioned embodiment. The first electrode film 43 can be deposited using the materials, deposition method, conditions, etc., similar to those for the above-mentioned bottom electrode film 2. The first electrode film 43 is a film that is to be the top electrode film in the piezoelectric element 20 (piezoelectric device 30) produced using the piezoelectric stack 10.

The second electrode film 44 is preferably comprised of an electrode (transparent electrode) with a light transmittance of, for example, 65% or more at least in the wavelength region of visible light, preferably in the wavelength region of visible light and near-infrared ray. The second electrode film 44 does not greatly affect the crystal structure of the KNN-film 3, unlike the first electrode film 43. Therefore, a crystal structure of the second electrode film 44, and a deposition method of the second electrode film 44 are not particularly limited, like the top electrode film 4 in the above-mentioned embodiment. The second electrode film 44 can be deposited using the materials, deposition method, conditions, etc., similar to those for the above-mentioned top electrode film 4. The second electrode film 44 is a film that is to be the bottom electrode film in the piezoelectric element 20 (piezoelectric device 30) produced using the piezoelectric stack 10.

A substrate (transparent substrate) with a light transmittance of, for example, 65% or more at least in the wavelength region of visible light, preferably in the wavelength region of visible light and near-infrared ray can be preferably used as the second substrate 45. The second substrate 45 does not greatly affect the crystal structure of the KNN-film 3, like the second electrode film 44. Therefore, a material, a crystal structure, surface (main surface) conditions such as surface roughness, a formation method, a thickness, and the like, of the second substrate 45 are not particularly limited. The second substrate 45 preferably has flexibility in addition to optical transmission. For example, a resin substrate (resin film) such as a polyimide substrate (polyimide film) can be preferably used as the second substrate 45.

The second substrate 45 can be bonded onto the second electrode film 44 by adhesion, fusion, or the like. When the bonding is performed by adhesion, an adhesive containing an epoxy resin, a silicone resin, or the like as a main component can be used. For example, the above-mentioned adhesive is applied onto the second electrode film 44 by a spin coating method or the like to form an adhesive layer, and the second substrate 45 is placed on the adhesive layer. Thus, the second substrate 45 can be bonded on the second electrode film 44. When the bonding is performed by fusion, a heat-fusible material, for example, a metal such as gold (Au) or a heat-fusible film is used instead of the adhesive, and the second substrate 45 is placed on the above-mentioned material in a molten state. After that, the above-mentioned material is solidified to accomplish the bonding.

The etching of the sacrificial layer 42 can be performed by the wet etching using, for example, a solution containing any one of hydrogen chloride (HCl), Diammonium Cerium (IV) Nitrate (($NH_4$)$_2$[Ce($NO_3$)$_6$]), or acetic acid ($CH_3COOH$) as the etching liquid. Etching conditions such as a concentration of the etching liquid, an etching time, and an etching temperature are adjusted according to the forming material, thickness, plane area, etc., of the sacrificial layer 42. For example, when the sacrificial layer 42 is formed using Ti, the stack 46 is immersed in a solution containing HCl at a concentration of, for example, 36.8% to etch the sacrificial layer 42. For example, when the sacrificial layer 42 is formed using SRO, the stack 46 is immersed in a solution containing Diammonium Cerium (IV) Nitrate at a concentration of, for example, 50 mol % to etch the sacrificial layer 42. For example, when the sacrificial layer 42 is formed using ZnO, the stack 46 is immersed in a solution containing acetic acid at a concentration of, for example, 33%, and heated to 50 to 60° C. to etch the sacrificial layer 42. The present inventors have confirmed that when the etching liquid is supplied to the stack 46 under the above-mentioned conditions, only the etching of the sacrificial layer 42 of the stack 46 can be allowed to proceed. The sacrificial layer 42 disappears upon the etching.

In a case of the piezoelectric stack 10 which does not require the bottom electrode film as mentioned in the above-mentioned modified example 1, it is not necessary to deposit the second electrode film 44. That is, the second substrate 45 may be directly bonded onto the KNN-film 3. In this case as well, the bonding method and bonding conditions similar to those mentioned above can be used.

Also in this modified example, the piezoelectric stack 10 including the KNN-film 3 having optical transmission similar to that of the above-mentioned embodiment can be obtained, and the effect similar to that of the above-mentioned embodiment can be obtained.

(Modified Example 3)

For example, an adhesion layer mainly comprised of titanium (Ti), tantalum (Ta), titanium oxide ($TiO_2$), nickel (Ni), ruthenium oxide ($RuO_x$), iridium oxide ($IrO_x$), etc., may also be provided between the substrate 1 and the bottom electrode film 2 or between the KNN-film 3 and the top electrode film 4 in order to enhance an adhesion between them as long as the above-mentioned light transmittance through the entire piezoelectric stack 10 is maintained, for example, at 50% or more. Thicknesses of these adhesion layers can be, for example, 1 to 10 nm.

(Modified Example 4)

The substrate 1 may be removed from the piezoelectric stack 10 when shaping the above-mentioned piezoelectric stack 10 into the piezoelectric element 20, as long as the piezoelectric device 30 produced using the piezoelectric stack 10 (piezoelectric element 20) can be applied to desired applications such as a sensor or an actuator.

Other Embodiments

As mentioned above, explanation has been given specifically for the embodiments of the present disclosure. However, the present disclosure is not limited thereto, and can be variously modified in a range not departing from the gist of the disclosure.

The above-mentioned embodiment has been described for a case where the piezoelectric device 30 produced by processing the piezoelectric stack 10 is used for the application requiring optical transmission as mentioned above, but is not limited thereto. For example, the piezoelectric device 30 can also be used for applications where it is not required to have optical transmission, including sensors such as angular velocity sensors, ultrasonic sensors, pressure sensors, and acceleration sensors, and actuators such as heads for inkjet printers, MEMS mirrors for scanners, vibrators for ultrasonic generators.

When the piezoelectric device 30 produced by processing the piezoelectric stack 10 is not required to have optical transmission, the substrate 1 does not have to be comprised of a transparent substrate. For example, a substrate similar to the first substrate 41 in the above-mentioned modified example may be used as the substrate 1. Similarly, the bottom electrode film 2 (second electrode film 44) does not have to be comprised of a transparent electrode. The bottom electrode film 2 (second electrode film 44) can be deposited using various metals such as Pt, Au, ruthenium (Ru), or iridium (Ir), or an alloy containing the above various metals as its main components. In this case, a thickness of the bottom electrode film 2 (second electrode film 44) can be, for example, 100 to 400 nm. Similarly, the top electrode film 4 (first electrode film 43) does not have to be comprised of a transparent electrode. The top electrode film 4 (first electrode film 43) can be deposited using various metals such as Pt, Au, aluminum (Al), or Cu, or an alloy of these various metals, for example. In this case, a thickness of the top electrode film 4 (first electrode film 43) can be, for example, 100 to 5000 nm. When the above-mentioned adhesion layer is provided between the substrate 1 and the bottom electrode film 2 or between the KNN-film 3 and the top electrode film 4, a thickness of the adhesion layer can be, for example, 1 to 200 nm.

When the piezoelectric device 30 produced by processing the piezoelectric stack 10 is not required to have optical transmission, a substrate formed of a metal material such as stainless steel or a substrate formed of a plastic material may be used as the second substrate 45 of the above-mentioned modified example. Various substrates such as a Si-substrate having a silicon nitride (SiN) film formed on a surface thereof, and a poly-Si-substrate can also be used as the second substrate 45. An SOI-substrate or a $SiO_2$-substrate, having a quality lower than that required for the substrate 1 or the first substrate 41 can also be used as the second substrate 45. An example of such a low quality substrate is a substrate having a rougher surface than the substrate 1 or the first substrate 41 (having a larger surface roughness than that of the substrate 1).

EXAMPLES

Explanation will be given for an experimental result supporting an effect of the above-mentioned embodiment hereafter.

A Si-substrate (surface is oriented preferentially in (100) direction, thickness: 610 μm, diameter: 6 inches) was prepared as a substrate. A thermal oxide film (thickness: 200 nm) was formed on the surface of the Si-substrate. Then, a piezoelectric stack was produced by depositing a Pt-film (oriented preferentially in (111) direction with respect to the surface of the substrate and having a thickness of 200 nm) as a bottom electrode film, and a KNN-film (oriented preferentially in (001) direction with respect to the surface of the substrate and having a thickness of 2 μm) as a piezoelectric film, in this order, on the Si-substrate (thermal oxide film). Cu was added into the KNN film so that a Cu-concentration (CuO-concentration) in the KNN-film was 2.0 at %. Then, the heat treatment was performed on the KNN-film under prescribed conditions. In this example, from a viewpoint of measuring the light transmittance through the KNN-film only, the piezoelectric stack including an opaque (non-light transmitting) Si-substrate, an opaque Pt-film, and the KNN-film having optical transmission was produced.

The Pt-film was deposited by the RF magnetron sputtering method. Conditions for depositing the Pt-film were as follows.

Treatment temperature: 300° C.
RF power: 1200 W
Gas: Ar-gas
Pressure in Ar-atmosphere: 0.3 Pa
Deposition time: 5 minutes The KNN-film was deposited by the RF magnetron sputtering method. Conditions for depositing the KNN-film were as follows.

Deposition temperature: 600° C.
RF power: 2200 W
Gas: $Ar+O_2$ mixed gas
Pressure in $Ar+O_2$ mixed gas atmosphere: 0.3 Pa
Partial pressure of Ar-gas to $O_2$-gas (Ar-partial pressure/$O_2$-partial pressure (ratio of partial pressure)): 25/1
Deposition rate: 1 μm/hr $(K_{1-x}Na_x)NbO_3$ sintered ceramics having a composition of (K+Na)/Nb=0.8 to 1.2 and Na/(K+Na)=0.4 to 0.7, and containing Cu at a concentration of 2.0 at %, was used as a sputtering target material for depositing the KNN-film into which Cu was added. The target material was produced as follows: $K_2CO_3$-powder, $Na_2CO_3$-powder, $Nb_2O_5$-powder, and CuO-powder were mixed for 24 hours using a ball mill, the mixture was provisionally burned at 850° C. for 10 hours, then pulverized using again the ball mill, and molded under a pressure of 200 MPa, and thereafter burned at 1080° C. The composition of the target material was controlled by adjusting a mixed ratio of $K_2CO_3$-powder, $Na_2CO_3$-powder, $Nb_2O_5$-powder, and CuO-powder, and measured by EDX (energy dispersive X-ray spectrometry) before performing the deposition.

Conditions for the heat treatment performed on the KNN-film were as follows.

Heat treatment atmosphere: Ambient air
Heat treatment temperature: 650° C.
Heat treatment time: 48 hours (Evaluation of Average Light Transmittance)

The evaluation of the average light transmittance through the KNN-film was performed according to the following procedure. The light transmittance through the piezoelectric film (KNN-film) included in the piezoelectric stack in the wavelength region of 380 to 1400 nm was measured using a spectroscopic ellipsometer before and after performing the heat treatment. The light transmittance was measured every 1 nm in the wavelength region of 380 to 1400 nm. Then, an average value (arithmetic mean value) of the measured values of the light transmittance within a prescribed wavelength range was calculated, and the calculated value was defined as the average light transmittance. The calculation results of the average light transmittance are as illustrated in the following Table 1.

TABLE 1

|  | Average light transmittance (%) | |
| --- | --- | --- |
|  | After heat treatment | Before heat treatment |
| Visible light + near-infrared (380 nm or more and 1400 nm or less) | 66.9 | 63.6 |
| Visible light (380 nm or more and 800 nm or less) | 58.8 | 54.3 |
| Visible light (purple) (380 nm or more and less than 450 nm) | 39.7 | 39.4 |
| Visible light (blue) (450 nm or more and less than 495 nm) | 51.3 | 46.6 |
| Visible light (green) (495 nm or more and less than 570 nm) | 58.2 | 52.2 |
| Visible light (yellow) (570 nm or more and less than 590 nm) | 61.9 | 55.8 |
| Visible light (orange) (590 nm or more and less than 620 nm) | 63.3 | 57.4 |
| Visible light (red) (620 nm or more and less than 750 nm) | 66.6 | 61.3 |
| Visible light (reddish purple) (750 nm or more and 800 nm or less) | 69.1 | 64.6 |
| Near-infrared (780 nm or more and 1400 nm or less) | 72.5 | 70.0 |

As can be seen from Table 1, the average light transmittance through the piezoelectric film in the wavelength region of visible light and near-infrared ray after the heat treatment is higher than that before the heat treatment, in any wavelength regions. That is, as can be seen from Table 1, performing the heat treatment can enhance the light transmittance through the piezoelectric film in the wavelength region of visible light and near-infrared ray. In addition, as can be seen from Table 1, an average light transmittance in the wavelength region of visible light and near-infrared ray is 65% or more even for the KNN-film containing Cu.

Preferable Aspects of the Present Invention

Preferable aspects of the present invention will be supplementarily described hereafter.

(Supplementary Description 1)

According to an aspect of the present disclosure, there is provided a piezoelectric stack, including:
a substrate;
an electrode film; and
a piezoelectric film comprising an alkali niobium oxide of a perovskite structure represented by a composition formula of $(K_{1-x}Na_x)NbO_3$ (0<x<1),
wherein an average light transmittance through the piezoelectric film in a wavelength region of visible light and near-infrared ray is 65% or more.

(Supplementary Description 2)

Preferably, there is provided the piezoelectric stack according to the supplementary description 1, wherein an average light transmittance through the piezoelectric film in a wavelength region of visible light is 56% or more.

(Supplementary Description 3)

Preferably, there is provided the piezoelectric stack according to the supplementary description 1 or 2, wherein the piezoelectric film contains at least one or more metallic elements selected from a group consisting of Cu and Mn at a concentration of 0.2 at % or more and 2.0 at % or less.

(Supplementary Description 4)

Preferably, there is provided the piezoelectric stack according to any one of the supplementary descriptions 1 to 3, wherein a light transmittance through the substrate at least in a wavelength region of visible light is 65% or more.

(Supplementary Description 5)

Preferably, there is provided the piezoelectric stack according to any one of the supplementary descriptions 1 to 4, wherein a light transmittance through the electrode film at least in a wavelength region of visible light is 65% or more.

(Supplementary Description 6)

Preferably, there is provided the piezoelectric stack according to any one of the supplementary descriptions 1 to 5, wherein a light transmittance through an entire piezoelectric stack at least in a wavelength region of visible light is 50% or more, preferably 60% or more.

(Supplementary Description 7)

According to still another aspect of the present disclosure, there is provided a piezoelectric element or a piezoelectric device, including:
a piezoelectric stack including:
a substrate;
a bottom electrode film deposited on the substrate;
a piezoelectric film deposited on the bottom electrode film, and comprising an alkali niobium oxide of a perovskite structure represented by a composition formula of $(K_{1-x}Na_x)NbO_3$ (0<x<1); and
a top electrode film deposited on the piezoelectric film,
wherein an average light transmittance through the piezoelectric film in a wavelength region of visible light and near-infrared ray is 65% or more.

(Supplementary Description 8)

Preferably, there is provided the piezoelectric element or the piezoelectric device according to the supplementary description 7, wherein a light transmittance through each of the substrate, the bottom electrode film, and the top electrode film at least in a wavelength region of visible light is 65% or more.

(Supplementary Description 9)

According to still another aspect of the present disclosure, there is provided a piezoelectric element or a piezoelectric device, including:
a piezoelectric stack including:
a substrate;
a piezoelectric film deposited on the substrate, and comprising an alkali niobium oxide of a perovskite structure represented by a composition formula of $(K_{1-x}Na_x)NbO_3$ (0<x<1); and
an electrode film deposited on the piezoelectric film,
wherein an average light transmittance through the piezoelectric film in a wavelength region of visible light and near-infrared ray is 65% or more.

(Supplementary Description 10)

The piezoelectric element or the piezoelectric device according to the supplementary description 9, wherein a light transmittance through each of the substrate and the electrode film at least in a wavelength region of visible light is 65% or more.

(Supplementary Description 11)

The piezoelectric element or the piezoelectric device according to any one of the supplementary descriptions 7 to 9, wherein a light transmittance through an entire piezoelectric stack at least in a wavelength region of visible light is 50% or more, preferably 60% or more.

(Supplementary Description 12)

According to still another aspect of the present disclosure, there is provided a method of manufacturing a piezoelectric stack, including:

(a) depositing a piezoelectric film comprising an alkali niobium oxide of a perovskite structure represented by a composition formula of $(K_{1-x}Na_x)NbO_3$ ($0<x<1$), on a substrate or on a substrate with an electrode film deposited on any one of main surfaces thereof, wherein, in (a), 65% or more average light transmittance through the piezoelectric film is obtained in a wavelength region of visible light and near-infrared ray, by increasing $H_2O$-partial pressure under a deposition atmosphere of the piezoelectric film.

(Supplementary Description 13)

According to still another aspect of the present disclosure, there is provided a method of manufacturing a piezoelectric stack, including:

(a) depositing a piezoelectric film comprising an alkali niobium oxide of a perovskite structure represented by a composition formula of $(K_{1-x}Na_x)NbO_3$ ($0<x<1$), on a substrate or on a substrate with an electrode film deposited on any one of main surfaces thereof; and (b) performing a heat treatment on the piezoelectric film in an ambient air or an in an oxygen-containing atmosphere, wherein 65% or more average light transmittance through the piezoelectric film is obtained in a wavelength region of visible light and near-infrared ray, by performing (b) after (a).

DESCRIPTION OF SIGNS AND NUMERALS

1: Substrate
2: Electrode film (bottom electrode film)
3: Piezoelectric film
4: Electrode film (top electrode film)
10: Piezoelectric stack

The invention claimed is:

1. A piezoelectric stack, comprising:
a substrate;
an electrode film; and
a piezoelectric film comprising an alkali niobium oxide of a perovskite structure represented by a composition formula of $(K_{1-x}Na_x)NbO_3$ ($0<x<1$),
wherein the piezoelectric film further comprises a metallic element selected from the group consisting of copper and manganese at a concentration within a range of 0.2 at % to 2.0 at %, and
an average light transmittance through the piezoelectric film in a wavelength region of 380 nm or more and 1400 nm or less is 65% or more.

2. The piezoelectric stack according to claim 1,
wherein an average light transmittance through the piezoelectric film in a wavelength region of 380 nm or more and 800 nm or less is 56% or more.

3. The piezoelectric stack according to claim 1,
wherein a light transmittance through the substrate at least in a wavelength region of 380 nm or more and 800 nm or less is 65% or more.

4. The piezoelectric stack according to claim 1,
wherein a light transmittance through the electrode film at least a wavelength region of 380 nm or more and 800 nm or less is 65% or more.

5. The piezoelectric stack according to claim 1,
wherein a light transmittance through an entire piezoelectric stack at least in a wavelength region of 380 nm or more and 800 nm or less is 50% or more.

6. A piezoelectric element, comprising:
a piezoelectric stack including:
a substrate;
an electrode film; and
a piezoelectric film comprising an alkali niobium oxide of a perovskite structure represented by a composition formula of $(K_{1-x}Na_x)NbO_3$ ($0<x<1$);
wherein the piezoelectric film further comprises a metallic element selected from a group consisting of copper and manganese at a concentration within a range of 0.2 at % to 2.0 at %, and
an average light transmittance through the piezoelectric film in a wavelength region of 380 nm or more and 1400 nm or less is 65% or more.

7. A method of manufacturing a piezoelectric stack, comprising:
(a) depositing a piezoelectric film comprising an alkali niobium oxide of a perovskite structure represented by a composition formula of $(K_{1-x}Na_x)NbO_3$ ($0<x<1$), on a substrate or on a substrate with an electrode film deposited on any one of main surfaces thereof,
wherein, in (a), 65% or more average light transmittance through the piezoelectric film is obtained in a wavelength region of 380 nm or more and 1400 nm or less, by increasing the $H_2O$-partial pressure under a deposition atmosphere of the piezoelectric film to 0.05 Pa or more.

8. A method of manufacturing a piezoelectric stack, comprising:
(a) depositing a piezoelectric film comprising an alkali niobium oxide of a perovskite structure represented by a composition formula of $(K_{1-x}Na_x)NbO_3$ ($0<x<1$), on a substrate or on a substrate with a bottom electrode film deposited on any one of main surfaces thereof;
(b) performing a heat treatment on the piezoelectric film in an ambient air or in an oxygen-containing atmosphere; and
(c) depositing a top electrode film on the piezoelectric film,
wherein 65% or more average light transmittance through the piezoelectric film is obtained in a wavelength region of 380 nm or more and 1400 nm or less, by performing (a), (b) and (c) in this order.

* * * * *